(12) United States Patent  
Landa

(10) Patent No.: US 9,343,830 B1
(45) Date of Patent: May 17, 2016

(54) INTEGRATED CIRCUIT CHIP TESTER WITH EMBEDDED MICRO LINK

(71) Applicant: XCERRA CORPORATION, Norwood, MA (US)

(72) Inventor: Victor Landa, Ladera Ranch, CA (US)

(73) Assignee: Xcerra Corporation, Norwood, MA (US)

( * ) Notice: Subject to any disclaimer, the term of this patent is extended or adjusted under 35 U.S.C. 154(b) by 0 days.

(21) Appl. No.: 14/733,314

(22) Filed: Jun. 8, 2015

(51) Int. Cl.
*H01R 12/71* (2011.01)
*H01R 4/48* (2006.01)

(52) U.S. Cl.
CPC ............. *H01R 12/714* (2013.01); *H01R 4/48* (2013.01)

(58) Field of Classification Search
CPC ............................. G01R 1/0466; H01R 12/714
USPC .............................................................. 439/66
See application file for complete search history.

(56) References Cited

U.S. PATENT DOCUMENTS

| | | | | |
|---|---|---|---|---|
| 4,445,735 A * | 5/1984 | Bonnefoy | ............ | H01R 12/714 439/591 |
| 5,069,629 A * | 12/1991 | Johnson | ............... | G01R 1/0433 439/591 |
| 5,207,584 A * | 5/1993 | Johnson | ............... | G01R 1/0433 439/66 |
| 5,360,348 A * | 11/1994 | Johnson | ............... | H05K 7/1023 439/330 |
| 5,388,996 A * | 2/1995 | Johnson | ............... | G01R 1/0433 439/65 |
| 5,594,355 A * | 1/1997 | Ludwig | ................ | H05K 7/1023 324/750.25 |
| 5,609,489 A * | 3/1997 | Bickford | ............. | G01R 1/0433 439/72 |
| 5,634,801 A * | 6/1997 | Johnson | ............... | G01R 1/0433 439/71 |
| 5,749,738 A * | 5/1998 | Johnson | ............... | G01R 1/0433 439/66 |
| 5,841,640 A * | 11/1998 | Shibata | ................ | H05K 7/1023 361/679.01 |
| 5,899,755 A * | 5/1999 | Kline | ................... | G01R 1/0466 439/66 |
| 5,913,687 A * | 6/1999 | Rathburn | .......... | H01R 13/2435 439/591 |
| 5,938,451 A * | 8/1999 | Rathburn | .......... | H01R 13/2414 439/66 |
| 5,947,749 A * | 9/1999 | Rathburn | .......... | H01R 13/2435 439/66 |
| 6,135,783 A * | 10/2000 | Rathburn | .......... | H01R 13/2414 439/592 |
| 6,203,329 B1 * | 3/2001 | Johnson | ............... | H01R 23/688 439/607.05 |
| 6,231,353 B1 * | 5/2001 | Rathburn | .......... | H01R 13/2414 439/66 |
| 6,244,874 B1 * | 6/2001 | Tan | ...................... | H05K 7/1023 439/66 |

(Continued)

*Primary Examiner* — Ross Gushi
(74) *Attorney, Agent, or Firm* — Fulwider Patton LLP

(57) ABSTRACT

A contact for testing an integrated circuit includes a contact body with multiple embedded links within the body having at least two axes of rotation. The contact body is hollow with cavities that house tubular resilient members to bias the embedded links in a first preferred orientation and position.

11 Claims, 4 Drawing Sheets

(56) References Cited

U.S. PATENT DOCUMENTS

| | | | |
|---|---|---|---|
| 6,409,521 B1* | 6/2002 | Rathburn | H01R 13/2435 439/66 |
| 6,529,025 B1* | 3/2003 | Kline | G01R 1/0466 324/754.18 |
| 6,570,393 B2* | 5/2003 | Johnson | G01R 1/0416 324/538 |
| 6,572,388 B2* | 6/2003 | Lee | G01R 1/0433 439/66 |
| 6,702,609 B2* | 3/2004 | Suzuki | H05K 7/1023 361/820 |
| 6,854,981 B2* | 2/2005 | Nelson | H01R 13/2435 439/591 |
| 7,059,866 B2* | 6/2006 | Gilk | G01R 1/0466 439/66 |
| 7,303,404 B2* | 12/2007 | Osato | G01R 1/0466 439/71 |
| 7,326,064 B2* | 2/2008 | Rathburn | H01R 13/2414 439/591 |
| 7,338,293 B2* | 3/2008 | Gilk | G01R 1/0466 439/66 |
| 7,445,465 B2* | 11/2008 | Lopez | G01R 1/0466 439/72 |
| 7,619,425 B2* | 11/2009 | Kimura | G01R 1/0466 324/756.05 |
| 7,632,106 B2* | 12/2009 | Nakamura | G01R 1/0466 439/591 |
| 7,639,026 B2* | 12/2009 | Shell | G01R 1/0466 324/754.03 |
| 7,645,164 B1* | 1/2010 | Ju | H01R 12/73 439/591 |
| 7,722,361 B2* | 5/2010 | Lopez | G01R 1/0466 439/72 |
| 7,737,708 B2* | 6/2010 | Sherry | G01R 1/06772 324/762.03 |
| 7,753,693 B2* | 7/2010 | Osato | G01R 1/0466 439/71 |
| 7,811,094 B2* | 10/2010 | Kuwahara | H01R 13/2407 439/66 |
| 7,819,672 B2* | 10/2010 | Osato | G01R 1/0466 439/66 |
| 7,914,295 B2* | 3/2011 | Nakamura | G01R 1/0466 439/331 |
| 7,918,669 B1* | 4/2011 | Tiengtum | G01R 1/0466 324/754.03 |
| 7,955,092 B2* | 6/2011 | Yang | G01R 1/0466 439/72 |
| 8,109,768 B2* | 2/2012 | Nikaido | H01R 12/57 174/262 |
| 8,441,275 B1* | 5/2013 | Alladio | G01R 1/0466 324/756.01 |
| 8,575,953 B2* | 11/2013 | Henry | G01R 1/06716 324/754.11 |
| 8,758,027 B1* | 6/2014 | Landa | G01R 1/0466 439/66 |
| 8,952,714 B2* | 2/2015 | Foong | G01R 1/0466 324/756.02 |
| 8,968,007 B2* | 3/2015 | Kuwahara | H01R 12/714 439/66 |
| 8,998,621 B2* | 4/2015 | Landa | H01L 23/32 439/66 |
| 9,140,721 B2* | 9/2015 | Foong | G01R 1/0466 |
| 9,147,954 B2* | 9/2015 | Yang | H01R 4/48 |
| 9,182,424 B2* | 11/2015 | Kuong | G01R 1/067 |
| 9,188,605 B2* | 11/2015 | Landa | G01R 1/0466 |
| 9,252,514 B2* | 2/2016 | Tatebe | H01R 12/714 |
| 9,274,141 B1* | 3/2016 | Andres | G01R 1/06738 |
| 2001/0016433 A1* | 8/2001 | Pieper | H01R 13/2407 439/66 |
| 2001/0016436 A1* | 8/2001 | Wimmer | H01R 43/007 439/66 |
| 2001/0019124 A1* | 9/2001 | Sakamoto | G01R 1/0466 257/48 |
| 2002/0003424 A1* | 1/2002 | Johnson | G01R 1/0416 324/538 |
| 2002/0045365 A1* | 4/2002 | Lee | G01R 1/0433 439/66 |
| 2004/0217771 A1* | 11/2004 | Leong | G01R 1/0466 324/754.08 |
| 2004/0248448 A1* | 12/2004 | Gilk | G01R 1/0466 439/264 |
| 2007/0007948 A1* | 1/2007 | Kimura | G01R 1/0483 324/750.25 |
| 2007/0032128 A1* | 2/2007 | Lopez | G01R 1/0466 439/525 |
| 2007/0236236 A1* | 10/2007 | Shell | G01R 1/0466 324/750.3 |
| 2007/0272924 A1* | 11/2007 | Yung-Sing | G01R 1/0466 257/48 |
| 2008/0006103 A1* | 1/2008 | Sherry | G01R 1/06772 73/866.5 |
| 2008/0054924 A1* | 3/2008 | Foong | G01R 1/0466 324/756.02 |
| 2008/0057757 A1* | 3/2008 | Arai | H01R 13/2414 439/86 |
| 2008/0182436 A1* | 7/2008 | Rathburn | H01R 13/2414 439/78 |
| 2008/0293306 A1* | 11/2008 | Kuwahara | H01L 23/49827 439/709 |
| 2009/0021274 A1* | 1/2009 | Kimura | G01R 1/0466 324/756.05 |
| 2009/0053912 A1* | 2/2009 | Lopez | G01R 1/0466 439/72 |
| 2009/0267629 A1* | 10/2009 | Foong | G01R 1/0466 324/756.02 |
| 2010/0003855 A1* | 1/2010 | Ju | H01R 13/2464 439/626 |
| 2010/0022104 A1* | 1/2010 | Osato | G01R 1/0466 439/65 |
| 2012/0299614 A1* | 11/2012 | Wu | G01R 1/0466 324/756.02 |
| 2014/0134899 A1* | 5/2014 | Na | G01R 1/0466 439/884 |
| 2015/0241474 A1* | 8/2015 | Landa | G01R 1/0466 324/756.02 |
| 2015/0244095 A1* | 8/2015 | Ju | H01R 12/7076 439/66 |
| 2015/0372407 A1* | 12/2015 | Landa | H01R 12/85 439/376 |

* cited by examiner

INTEGRATED CIRCUIT CHIP TESTER WITH EMBEDDED MICRO LINK

BACKGROUND

The present invention relates to sockets that electrically connect an integrated circuit with an IC board. More particularly, the present invention is directed to a thermal contact with an embedded flexible link that maximizes thermal and electrical contact for both signal and ground contacts while emphasizing scrub movement. Sockets, such as those used for testing or connecting an integrated circuit, utilize the thermal contacts to achieve a positive connection between an IC device under test (DUT) and a board, such as a load board of a piece of test equipment or other fixture.

Integrated circuit tester devices have long been used in the semiconductor industry to test and evaluate the quality of the chips off the manufacturing line. Signal integrity is a critical aspect of chip design and testing. To this end, it is desirable to maintain impedance through a conducting portion of a contact interconnecting the integrated circuit lead to its corresponding load board pad at a particular desired level. The effective impedance of the design is a function of a number of factors. These include width and length of conduction path, material of which the conductive structure is made, material thickness, etc.

When testing the electrical characteristics of a packaged or molded semiconductor device such as an integrated circuit (IC), it is common to utilize a specialized test socket that secures and connects the IC to the equipment that evaluates its performance, i.e. a load board. Many different test sockets have been devised for quickly and temporarily connecting integrated circuit leads of a chip to be tested to a load board of a tester. Automated test apparatus in particular use a number of such sockets. Typical socket arrangements use force brought to bear upon a contact positioned between a lead of the IC and the load board to deform a probe tip of the contact and engage a pad on the load board. Such a configuration provides for positive connection between the pins or contact pads of the DUT and corresponding leads of a test apparatus. Examples of this type of connection can be found, for example, in U.S. Pat. No. 6,409,521 to Rathburn, and U.S. Pat. No. 7,737,708 to Sherry, the teachings and contents of both of which are fully incorporated herein by reference.

Whether it is for testing integrated circuits or for mounting such circuits on a board, appropriate socket-like connectors are needed. Factors such as cost, having a low profile, and shortening the electrical signal path drive the industry to constantly seek to improve on the prior art sockets. A solution to the foregoing was provided by U.S. Pat. No. 7,918,669 to Tiengtum, and assigned to the present assignee, the contents of which are fully incorporated herein by reference. A feature of that device was a cylindrical elastomer that provided a resilient biasing of the connectors, which allowed the testing device to reliably make effective contact with the device under test (DUT).

It is important for such sockets to promote both thermal scrub and pad scrub when the DUT is placed in the socket. The present invention is designed to advance the contact and scrub characteristics of the contact with the DUT to increase the effectiveness and performance of the socket and contact.

SUMMARY OF THE INVENTION

The present invention is a contact having embedded resilient micro links enclosed on three sides with a protrusion that maintains contact in the Z direction. A cutout feature allows floating contact with a lollipop cutter, and a smooth flat base enhances contact with the tester. Micro links are spaced along the contact to coincide with electrical contacts on the DUT, and multiple pins can be implemented in a single contact. An elastomer member provides the resiliency for pin contact, and the pad scrub as well as the thermal transfer is advanced by the present invention.

These and many other features of the present invention will best be understood by reference to the following descriptions and figures. However, it is to be understood that while the inventor's best mode has been described and shown, the invention is not to be limited to any particular drawing or description. Rather, it is understood that there may be many variations of the present invention that would be readily appreciated by one of ordinary skill in the art, and the invention encompasses all such variations and modifications.

DETAILED DESCRIPTION OF THE PREFERRED EMBODIMENTS

Figure 1:
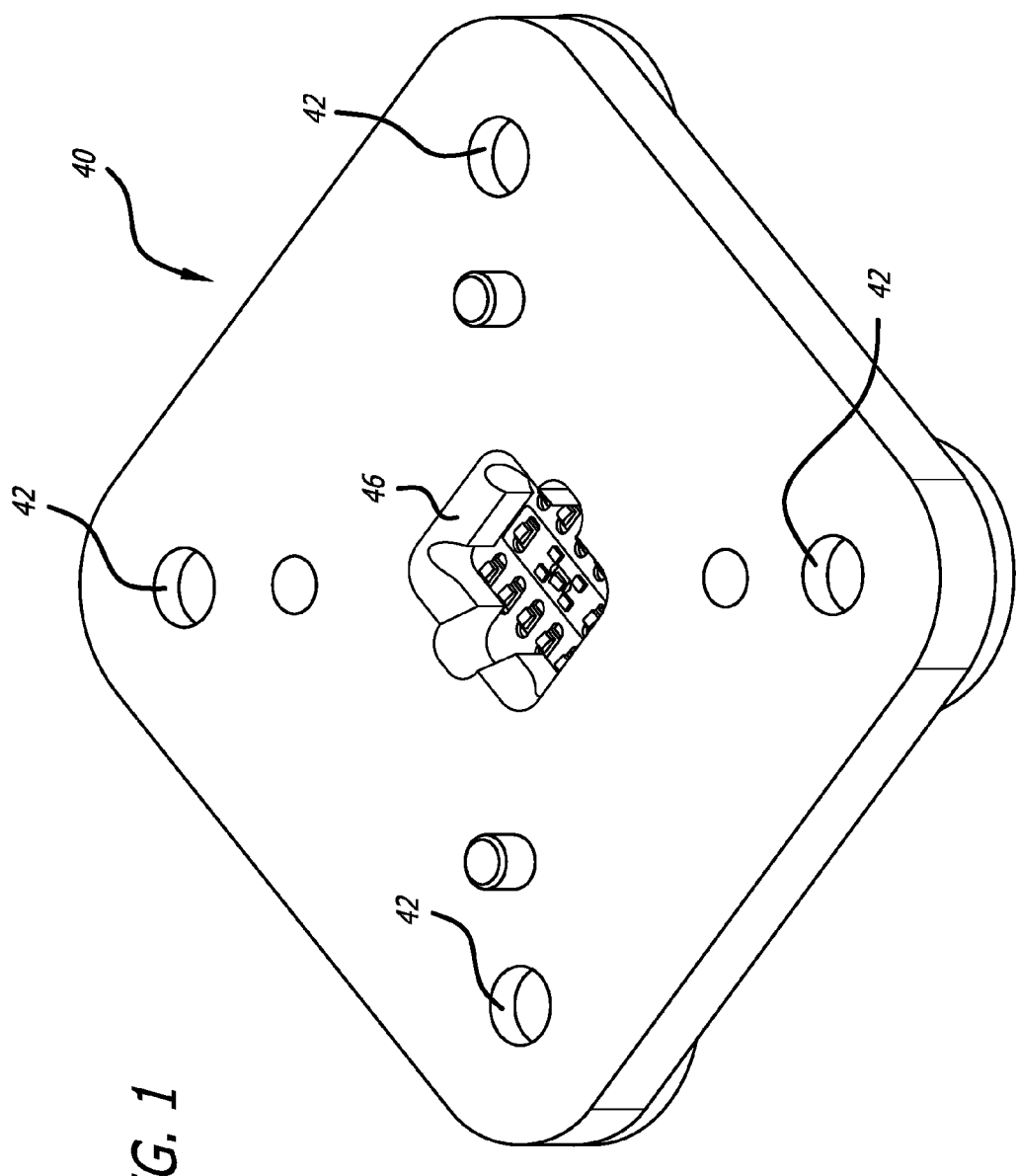
FIG. 1 an elevated, perspective view of a socket used to test integrated circuits using the contact of the present invention.

FIG. 1 illustrates an integrated circuit test socket 40 of the type generally described in U.S. Pat. No. 7,918,669, the contents of which are incorporated herein. The test socket 40 has a generally square profile with up to four aligning holes 42 to mount the test socket on the testing equipment. On the test socket is a generally square recess 46 is formed to receive the integrated circuit chip under test. A plurality of electrical connectors are formed within the recess 46 as described more fully in the '669 patent referenced above. Once the chip is placed in the recess 46, the test socket 40 may be placed, for example, in a handler work press and clamped in the handler in anticipation of testing the integrated chip. Other arrangements, both automated and manual, are also possible with the present invention.

Figure 2:
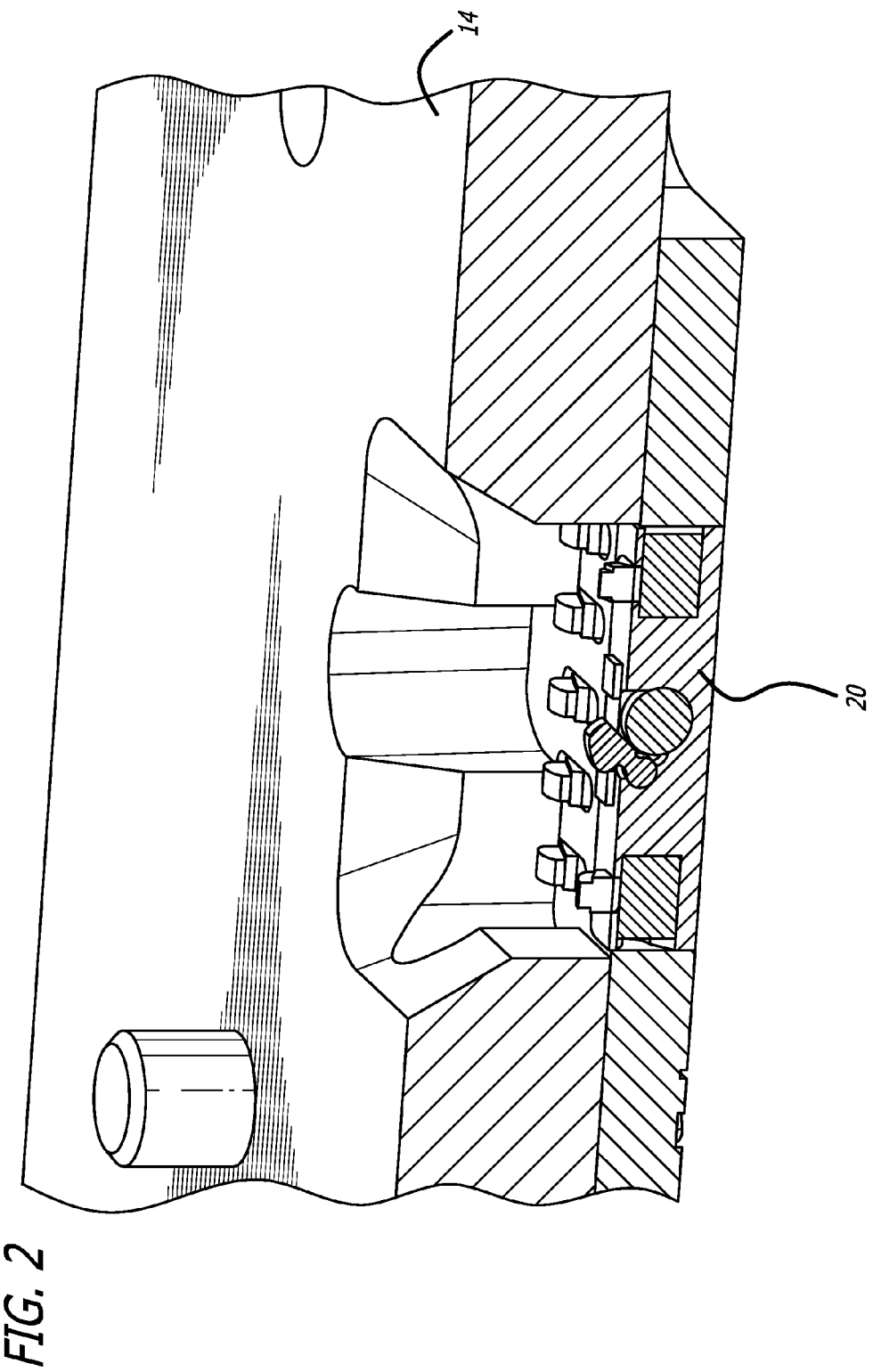
FIG. 2 is an enlarged, partially cut away perspective view of the contact of the present invention.

FIG. 2 illustrates a chip 14 (partially cut away) in the socket 40, which the chip 14 makes electrical and thermal connection with a contact 20. The connection between the chip 14 and the contact 20 is then evaluated by measuring a signal (thermal or electrical) that is measured at the contact 20 and relayed to the testing device. In this manner, the response of the chip to contact and temperature can be tested prior to shipment of the chip.

Figure 3:
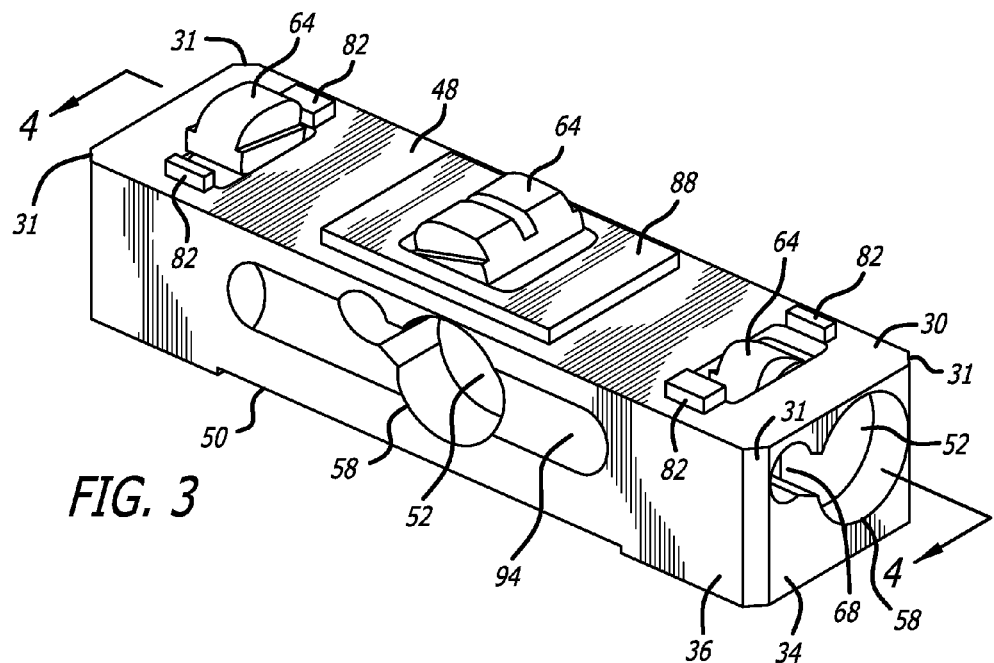
FIG. 3 is an elevated, perspective view of the contact of the present invention outside of the socket.
Figure 4:
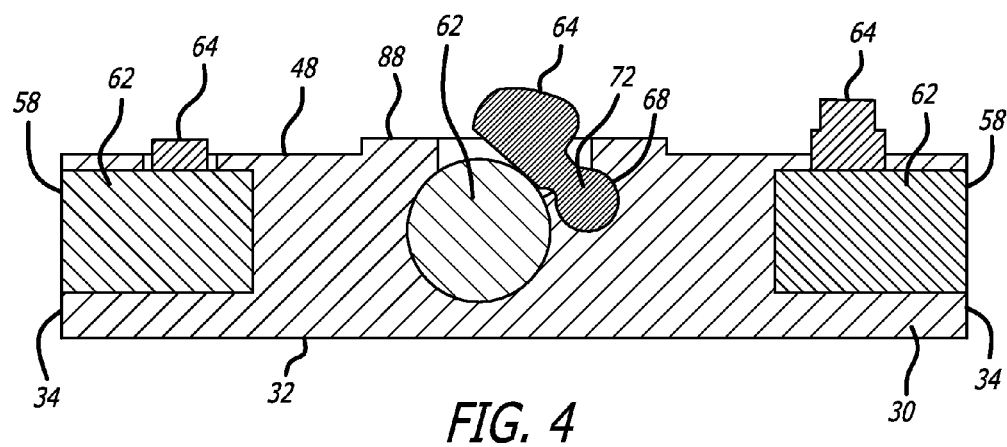
FIG. 4 is a cross-sectional view along lines 4-4 of the contact of FIG. 3.
Figure 5:
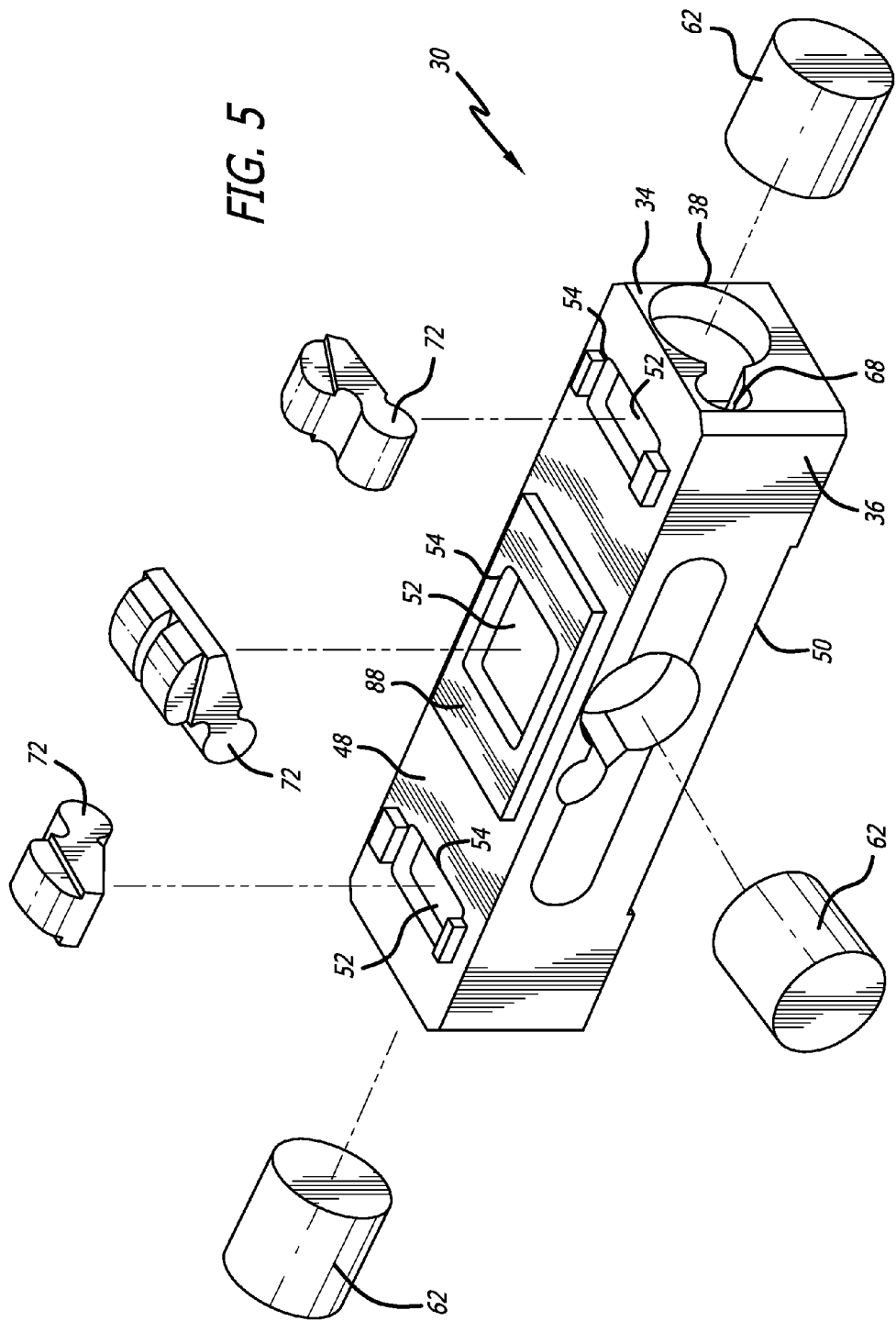
FIG. 5 is an exploded view of the contact of FIG. 3.

FIGS. 3-5 illustrate a first preferred contact 30 for the socket described above. The contact is a body of generally rectangular profile with a smooth bottom surface 32, left and right sides 34, a front surface 36, a rear surface 38, and an upper surface 48. The contact body 30 has substantially smooth faces, with beveled edges 31 and the front and rear surfaces may include indentions 50 along a lowermost edge for aligning the contact with a tester.

The contact further includes a plurality of cavities 52 that are bored into the contact body 30. Each cavity 52 has associated with it a first opening 54 in the upper surface 48 that allows a contact link to protrude through from its associated cavity 54. Further, each cavity is also associated with a second opening 58 in either the adjacent side or the front surface, depending upon the location of the cavity. In most cases, the cavities closest to the ends of the contact body will have associated second openings in the sides 34 of the contact, while the remaining cavities have second openings 58 in the front surface 36 of the contact. The second openings allow the contact links to communicate with the tester by connecting the links to wires (not shown) that measure signal or temperature.

In each cavity 52 resides a resilient tubular member made of a polymer that can provide a biasing force on the contact links to maintain the links in an upright or inclined position. The resilient tubular members 62 are positioned in the respective cavities 52 through the selectively sized associated second openings 58 adjacent the first openings 54 on the upper surface 48. In a preferred embodiment, the tubular members 62 are cylindrical but in each case have associated therewith a longitudinal axis.

Each cavity includes a designated contact link 64 positioned to make contact with an associated pin on the chip to be tested. Each contact link 64 is biased by a resilient tubular member 62 so as to extend from its associated cavity 52 through its associated first opening 54. The contact links 64 are biased by its respective tubular member 62 in a first extended position toward the chip pin, and each contact link 64 is arranged for pivotal movement about an axis parallel to the axis of the respective tubular member. More specifically, in a preferred embodiment each cavity 52 includes a chamber 68 (see FIG. 4) sized and shaped to receive a mating circular fulcrum 72 of a contact link 64 for pivoting movement therein. With the contact link's fulcrum 72 in the chamber 68 of the cavity 52, the contact link rocks or pivots therein about an axis that is parallel to the longitudinal axis of the associated resilient tubular member 62.

When a chip is placed on the contact 30, the connectors of the chip bear against the contact links 64, causing the links to pivot about their respective fulcrums 72 in a downward arc against the biasing of the resilient tubular member 62. In this manner, solid and reliable contact is established with the chip at each connector, which can then be measured by transmitting a signal through the associated side/second opening. By controlling the placement of the tubular member 62 and the opening 54, the direction of the rotation of each contact link 64 can be individually selected. That is, a rotation of a first contact link may be in a clockwise direction and a rotation of a second contact link is in a counter-clockwise direction when viewed from the left or right side surfaces. Moreover, rotation can also be about perpendicular axes, as shown in FIG. 4, where the rotation of a first contact link is in a longitudinal direction with respect to the contact body itself, and a second contact link rotates about a transverse axis of rotation orthogonal to the first axis of rotation. Thus, each contact link can be controlled to pivot or rotate is a specified direction as called for by the particular chip and application.

The contact body on the upper surface can include front and rear vertical spacers 82 to establish a limit for the chip to bear against the contact body 30, where each vertical spacer 82 has a common height. The vertical spacers 82 are preferably adjacent at least two openings on the upper surface 48, and more preferably at each end of the contact body. The upper surface of the contact body may further include a spacer platform 88 about a central first opening on the upper surface 48, where the spacer platform 88 has a height that is equivalent to a height of the spacers 82.

The front surface of the contact body 30 may include an elongate arcuate recess 94 extending horizontally therein for aligning the contact with a mating component on the testing device, or an adjacent second contact.

It will be understood that this disclosure is merely illustrative, and that it is to be further understood that changes may be made in the details, particularly in matters of shape, size, material, and arrangement of parts without exceeding the scope of the invention. Accordingly, the scope of the invention is as defined in the language of the appended claims, and is not limited in any manner by the aforementioned descriptions and drawings.

I claim:

1. A contact for testing an integrated circuit, comprising:
an elongate contact body including a front surface and a rear surface, first and second side surfaces, and an upper surface, and a plurality of cavities in the elongate contact body, each cavity having associated therewith a first opening in the upper surface and a second opening in one of the side and front surfaces;
a plurality of resilient tubular members, each disposed in a respective one of said plurality of cavities, each resilient tubular member having a longitudinal axis, each respective second opening associated with a respective cavity sized to receive its resilient tubular member therethrough; and
a plurality of contact links each associated with a respective one of said tubular members and extending from said associated cavity through said respective first opening in the upper surface, the plurality of contact links biased by its respective tubular member in a first extended position, each contact link arranged for pivotal movement about an axis parallel to the axis of the respective tubular member.

2. The contact for testing an integrated circuit of claim 1, wherein a rotation of a first contact link is in a clockwise direction and a rotation of a second contact link is in a counter-clockwise direction when viewed from the first side surface.

3. The contact for testing an integrated circuit of claim 1, wherein a rotation of a first contact is about an axis of rotation that is orthogonal to an axis of rotation of a second contact.

4. The contact for testing an integrated circuit of claim 1, wherein the upper surface include front and rear vertical spacers adjacent at least two openings on the upper surface.

5. The contact for testing an integrated circuit of claim 4, further comprising a spacer platform about a central opening on the upper surface, the spacer platform having a height equal to a height of the vertical spacers.

6. The contact for testing an integrated circuit of claim 1, wherein the front and rear surface include indentions along a lowermost edge for aligning the contact with a tester.

7. The contact for testing an integrated circuit of claim 1, wherein the front surface includes an elongate arcuate recess extending horizontally therein.

8. The contact for testing an integrated circuit of claim 1, wherein each second opening is sized to receive the contact link associated therewith.

9. The contact for testing an integrated circuit of claim 1, wherein each cavity includes a chamber sized to receive a mating circular fulcrum of a contact link for pivoting movement therein.

10. The contact for testing an integrated circuit of claim 1, wherein the resilient tubular members are cylindrical.

11. The contact for testing an integrated circuit of claim 1, wherein at least one second opening is on the front surface and at least one second opening is on a first or second side surface.

* * * * *